United States Patent
Huber et al.

(10) Patent No.: US 11,156,524 B2
(45) Date of Patent: Oct. 26, 2021

(54) BREAKING DEVICE INCLUDING AN ELECTRONIC CONTROL UNIT FOR PRESSURE MEASUREMENTS

(71) Applicant: KNORR-BREMSE SYSTEME FUER NUTZFAHRZEUGE GMBH, Munich (DE)

(72) Inventors: Christian Huber, Munich (DE); Klaus Lechner, Pretzfeld (DE); Friedbert Roether, Cleebronn (DE); Karin Pohley, Nuremberg (DE); Amadeus Mlynarski, Munich (DE); Stefan Niedermeier, Haarbach (DE)

(73) Assignee: KNORR-BREMSE SYSTEME FUER NUTZFAHRZEUGE GMBH, Munich (DE)

( * ) Notice: Subject to any disclaimer, the term of this patent is extended or adjusted under 35 U.S.C. 154(b) by 116 days.

(21) Appl. No.: 16/497,272

(22) PCT Filed: Mar. 21, 2018

(86) PCT No.: PCT/EP2018/057129
§ 371 (c)(1),
(2) Date: Sep. 24, 2019

(87) PCT Pub. No.: WO2018/177833
PCT Pub. Date: Oct. 4, 2018

(65) Prior Publication Data
US 2020/0378855 A1    Dec. 3, 2020

(30) Foreign Application Priority Data
Mar. 27, 2017    (DE) .......................... 102017106553.9

(51) Int. Cl.
| | | |
|---|---|---|
| *G01L 19/14* | (2006.01) | |
| *G01L 19/06* | (2006.01) | |
| *H05K 5/00* | (2006.01) | |

(52) U.S. Cl.
CPC ........ *G01L 19/147* (2013.01); *G01L 19/0654* (2013.01); *H05K 5/0065* (2013.01)

(58) Field of Classification Search
None
See application file for complete search history.

(56) References Cited

U.S. PATENT DOCUMENTS

| | | | | |
|---|---|---|---|---|
| 9,488,619 | B2 * | 11/2016 | Nesic | ................... G01N 17/008 |
| 2001/0049965 | A1 * | 12/2001 | Groger | ................... G01L 19/14 |
| | | | | 73/753 |
| 2011/0079085 | A1 | 4/2011 | Kanda et al. | |

FOREIGN PATENT DOCUMENTS

| | | |
|---|---|---|
| CN | 101506560 A | 8/2009 |
| CN | 102439408 A | 5/2012 |

(Continued)

OTHER PUBLICATIONS

International Search Report dated Jun. 25, 2018, of the corresponding International Application PCT/EP2018/057129 filed Mar. 21, 2018.

*Primary Examiner* — Lisa M Caputo
*Assistant Examiner* — Nigel H Plumb
(74) *Attorney, Agent, or Firm* — Norton Rose Fulbright US LLP; Gerard Messina; Aaron Deditch

(57) ABSTRACT

An electronic control unit for a vehicle, including: a pressure-sensor-element (PSE); a housing having a pressure-guide by which the PSE has a pressure-medium applied to it under pressure; an evaluation-unit to generate a pressure-signal, dependent on the pressure detected by the pressure-sensor-element in the pressure-guide; and a circuit-carrier on which at least part of control-electronics of the control-unit (Continued)

is arranged; the pressure-signal of the evaluation-unit being put in the control-electronics, the pressure-guide making direct contact with the circuit-carrier and a sealing-element arranged in the contact-region between the pressure-guide and the circuit-carrier, the sealing-element sealing a region of the pressure-guide to which the pressure-medium is applied under pressure from the surroundings, the PSE being arranged directly on the circuit-carrier, such that the PSE is arranged in the region of the pressure-guide to which the pressure-medium is applied under pressure, and the evaluation-unit being electrically directly connected to the circuit-carrier.

19 Claims, 1 Drawing Sheet

(56) References Cited

FOREIGN PATENT DOCUMENTS

| | | |
|---|---|---|
| CN | 104062064 A | 9/2014 |
| DE | 10022124 A1 | 8/2001 |
| DE | 102004053200 A1 | 5/2006 |
| DE | 102009026444 A1 | 12/2010 |
| DE | 102010043393 A1 | 6/2011 |
| DE | 102010029868 A1 | 12/2011 |
| EP | 1152231 A2 | 11/2001 |

* cited by examiner

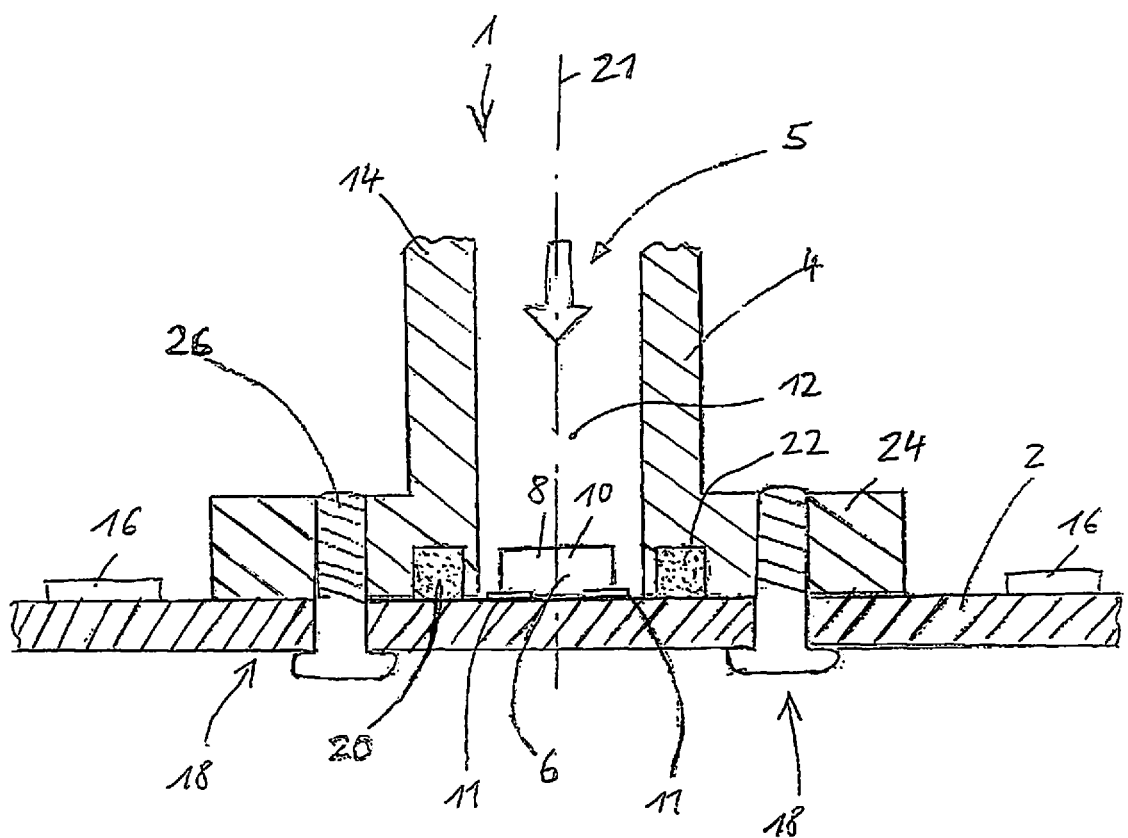

BREAKING DEVICE INCLUDING AN ELECTRONIC CONTROL UNIT FOR PRESSURE MEASUREMENTS

FIELD OF THE INVENTION

The invention relates to a control unit for a vehicle having at least one pressure sensor element and a housing having a pressure guide by which the pressure sensor element has a pressure medium applied to it under pressure, and also having an evaluation unit that generates a pressure signal that is dependent on the pressure detected by the pressure sensor element in the pressure guide, and also having a circuit carrier on which at least part of control electronics of the control unit is arranged, wherein the pressure signal is introduced into the control electronics.

BACKGROUND INFORMATION

It is believed to be understood that there are control units having pressure sensors in housings having a separate pneumatic connection that make electrical contact with a printed circuit board of the control unit, e.g. by soldering, welding, in a bonded manner, or are plugged in and connected to pressure-guiding assemblies by a separate pressure guide element. The sealing is then provided on the pressure sensor housing at the separate pressure guide element. Tolerances are then compensated for by the separate pressure guide element, e.g. a pressure pipe.

SUMMARY OF THE INVENTION

By contrast, the invention is based on the object of providing a control unit of the type mentioned at the outset that is easier to produce.

This object may be achieved according to the invention by the features described herein.

The invention is based on the understanding that
at least part of the pressure guide makes direct contact with the circuit carrier and sealing element are arranged in the contact region between the pressure guide and the circuit carrier, which sealing element seals a region of the pressure guide to which the pressure medium is applied under pressure from the surroundings, and that
the pressure sensor element is arranged directly on the circuit carrier and moreover thereon such that the pressure sensor element is arranged in the region of the pressure guide to which the pressure medium is applied under pressure, and that
the evaluation unit is electrically directly connected to the circuit carrier.

The pressure guide "making direct contact" with the circuit carrier must therefore be understood to mean that just the sealing element can then be arranged between the pressure guide and the circuit carrier.

An "electrically direct connection" between the evaluation unit and the circuit carrier must be understood to mean that this electrical connection is accomplished without further connecting elements such as for example contact feet.

The circuit carrier may be in the form of a printed circuit board and, besides the control electronics or parts thereof, also contains output stages, for example.

The measures described above allow the separate pressure guide element to be dispensed with, which means that sealing surfaces and also the fitting of the pressure guide element can be economized on. Furthermore, a reduced physical form is obtained as a result of the dispensing with the housing of the pressure sensor and the pneumatic connection that is then possible. Furthermore, the direct pneumatic contact being made between the pressure sensor and the direct seal of the pressure guide on the printed circuit board means that there is also no longer a need for compensating for tolerances.

The measures listed in the subclaims allow advantageous developments and improvements of the invention specified herein.

As a particular preference, a circuit board of the evaluation unit makes direct contact with the circuit carrier. To this end, the evaluation unit can have for example at least one electrical contact area that makes direct contact with the circuit carrier. In this case, the electrical contact area of the evaluation unit may be bonded or soldered to the circuit carrier.

According to one development, the evaluation unit can be formed by at least one ASIC. An ASIC is an application-specific integrated circuit as an electronic circuit realized as an integrated circuit. The function of an ASIC is therefore no longer alterable. A purely digital ASIC may be used, which incorporates a large number of logic functions that would otherwise need to be compiled from various standard chips such as a processor, logic families or similar chips. Alternatively, a mixed-signal ASIC can be used, which consists of digital and analogue functions. In this case, there is then an analogue circuit such as e.g. an analogue-to-digital converter present.

According to one variant, the evaluation unit and the at least one pressure sensor element may be arranged on different lateral faces of the circuit carrier.

According to a further variant, the evaluation unit and the at least one pressure sensor element can also form a subassembly. This subassembly may then be arranged on a separate carrier, e.g. a ceramic plate or an FR4, or in a dedicated housing.

According to one development, the sealing element can contain an elastic mold seal, held in a recess in a surface of the pressure guide, that is pretensioned against a surface of the circuit carrier.

Alternatively or additionally, the sealing element can contain at least one adhesive bond between a surface of the pressure guide and a surface of the circuit carrier. In this case, besides its function of producing the material bond between pressure guide and circuit carrier, the adhesive serves as a sealing element at the same time.

The pressure guide may in particular be tubular and detachably or nondetachably connected to the circuit carrier. In that case, in particular one end face of a tubular pressure guide can make direct contact with an area of the circuit carrier. In this case, the circuit carrier then forms a base of the pressure guide. In particular, a central or longitudinal axis of the pressure guide is arranged perpendicularly to the circuit carrier.

In particular, the surface of the circuit carrier with which the pressure guide makes contact also has in particular its geometry (planarity) and surface structure in a form such that it has a sealing function. To provide a suitable surface structure on the circuit carrier, which is in the form of a printed circuit board, for example, the conductor tracks can be disentangled and the plated-through holes sealed, for example. A solder resist, which is present on the circuit carrier anyway as a rule, can also form a sealing surface vis-à-vis the pressure guide.

Sensitive regions such as the electrical contact made for the pressure sensor element and/or the evaluation unit on the circuit carrier can be protected by gel, lacquer, etc.

There can also be provision made for multiple pressure sensor elements and evaluation units in an array on the circuit carrier, the pneumatic contact with the pressure guide then being able to be made for example via multiple pressure channels by using one or more sealing elements (O-ring, mold seal, adhesive bond, injected seal).

The circuit carrier and the direct pneumatic contact it makes with the pressure guide may be arranged directly on or in a solenoid valve or on or in a valve block.

Alternatively, there can also be provision made for at least one additional pressure-guiding assembly or a channel that pneumatically connects the solenoid valve or the valve block to the pressure guide.

Calibration of the evaluation unit of the at least one pressure sensor element can then take place after it is fitted to the circuit carrier, in order to reduce influences on the pressure signal of the evaluation unit as a result of mechanical tensioning.

Furthermore, the circuit carrier, for example a printed circuit board, may also be mounted on the housing.

The invention also relates to a device, in particular an electropneumatic braking device, operated with a pressure element, containing at least one electronic control unit described above. The electropneumatic braking device then contains in particular a solenoid valve device realized for example in a valve block, wherein the solenoid valve device comprises at least one solenoid valve or valve (e.g. relay valve) having at least one inlet and at least one outlet. The electronic control unit then takes the pressure signal of the evaluation device as a basis for electrically controlling the solenoid valve device of the electropneumatic braking device. The pressure signal can represent for example an actual braking pressure, controlled by the solenoid valve device, that is then regulated for example to a setpoint braking pressure as part of braking pressure regulation implemented in the control unit. The solenoid valve device and the control unit are then integrated in an electropneumatic pressure regulation module, for example.

The housing of the control unit may then be connected to the valve block of the solenoid valve device, and the pressure guide may be connected to at least one inlet or an outlet of at least one valve (e.g. relay valve) or solenoid value of the solenoid valve device.

Further measures improving the invention are depicted more specifically below together with the description of an exemplary embodiment of the invention with reference to the drawing.

BRIEF DESCRIPTION OF THE DRAWING

The FIGURE depicts an exemplary embodiment of the invention, and shows a cross-sectional depiction of a control unit of an electropneumatic braking device according to one embodiment of the invention.

DETAILED DESCRIPTION

The FIGURE shows a control unit 1 of an electropneumatic braking device as an exemplary embodiment of an electronic control unit. For reasons of scale, only one circuit carrier 2, for example a printed circuit board, and a pressure guide 4 and also a subassembly 6 including a pressure sensor element 8 and an associated evaluation unit 10 are shown from the control unit 1 in this case.

The pressure guide 4 is for example in tubular form in this case and has a, in this case inner, region 12 to which a pressure medium 5, in this case compressed air, may be applied under pressure. The pressure guide 4 may be part of a housing 14 of the control unit 1. The housing 14 is for example directly mounted on a valve block, not shown in this case, or on a solenoid valve, not shown in this case, of a solenoid valve device of the electropneumatic braking device, the control unit 1 controlling the solenoid valves of the solenoid valve device.

By way of example, the pressure guide 4 is pneumatically connected to an inlet or outlet of at least one solenoid valve or valve (e.g. relay value) of the solenoid valve device, in which case the pneumatic pressure prevailing at this inlet or outlet is then present in the, in this case inner, region 12 of the pressure guide 4 to which pressure is applied.

The evaluation unit generates an electrical pressure signal that is dependent on the pressure detected by the pressure sensor element in the pressure guide and that may be analogue or already digital. The pressure signal is then introduced into control electronics 16 on the circuit carrier 2 of the control unit 1 and processed there. The control electronics 16 then (also) take the pressure signal of the evaluation unit 10 of the pressure sensor element 8 as a basis for actuating the solenoid valves of the solenoid valve device. The circuit carrier 2 contains not only the control electronics 16 with controllers or parts of the control electronics 16 but also the output stages for the solenoid valves, for example.

As emerges from the FIGURE, the pressure guide 4 makes direct contact with the circuit carrier 2. Furthermore, the contact region 18 between the pressure guide 4 and the circuit carrier 2 has a sealing element 20 arranged in it that seal the, in this case inner, region 12 of the pressure guide 4 to which the pressure medium 5 is applied under pressure from the surroundings, which in this case are formed by the remainder of the interior of the control unit 1.

Furthermore, the pressure sensor element 8 is arranged directly on the circuit carrier 2 and moreover thereon such that the pressure sensor element 8 is arranged in the region 12 of the pressure guide 4 to which the pressure medium 5 is applied under pressure. In this case, the circuit carrier 2 may form a base of the pressure guide 4, on which the pressure sensor element 8 is arranged. Furthermore, the evaluation unit 10 is electrically connected to the circuit carrier 2 directly, i.e. without intermediate elements such as contact feet.

According to the embodiment described here, the evaluation unit 10 and the pressure sensor element 8 form a subassembly 6. This subassembly 6 is arranged in a dedicated housing in this case, for example. In that case, a circuit board of the evaluation unit 10 may make direct contact with the circuit carrier 2, for example by virtue of the evaluation unit 10 or the circuit board thereof having at least one electrical contact area 11 on the housing of the subassembly 6 that makes direct contact with the circuit carrier 2. In that case, the electrical contact area 11 of the evaluation unit 10 may be bonded or soldered to the circuit carrier 2. The evaluation unit 10 is formed by at least one ASIC, for example.

According to an alternative embodiment, which is not shown in this case, the evaluation unit 10 and the pressure sensor element 8 may also be arranged not in one subassembly but rather separately on different lateral faces of the circuit carrier 2, in particular which point away from one another.

As shown in this case the sealing device (element) 20 can contain an elastic mold seal held in a recess, e.g. groove 22, in a surface of the pressure guide 4 pointing toward the circuit carrier 2, in this case for example an O-ring pretensioned against an opposite surface of the circuit carrier 2. The O-ring is in this case therefore may be held in the groove 22 in the end face of the bushing 4 that points toward the circuit carrier, which end face at the same time forms a flange surface of a flange 24 arranged at the end of the bushing 4. The planar flange 24 is then in this case detachably mounted on the likewise planar circuit carrier 2, for example by a screw joint 26, with the tensile force of the screws then compressing the O ring 20 and bringing about the sealing action. Therefore, in this case a planar end face of the pressure guide 4 makes contact with a planar surface of the circuit carrier 2 directly and/or via the sealing element 20. In particular, a central or longitudinal axis 21 of the pressure guide 4 is arranged perpendicularly to the circuit carrier 2.

Alternatively or additionally, the sealing element can contain at least one adhesive bond between a surface of the pressure guide 4 and a surface of the circuit carrier 2. In this case, the adhesive serves as sealing element 20 at the same time. The pressure guide 4 is then nondetachably connected to the circuit carrier 2 by a material bond.

In particular, the surface of the circuit carrier 2 with which the pressure guide 4 makes contact has in particular its geometry (roughness, planarity) and surface structure in a form such that it (also) has a sealing function. A solder resist that is present on the circuit carrier 2 as a rule can also be used as a sealing surface vis-à-vis the end face of the pressure guide 4.

The List of Reference Signs is as follows:
1 Control unit
2 Circuit carrier
4 Pressure guide
5 Pressure medium
6 Subassembly
8 Pressure sensor element
10 Evaluation unit
11 Contact area
12 Region to which pressure is applied
14 Housing
16 Control electronics
18 Contact region
20 Sealing element
21 Central axis
22 Groove
24 Flange
25 Sealing element
26 Screw joint

The invention claimed is:

1. An electronic control unit for a vehicle, comprising:
at least one pressure sensor element;
a housing having a pressure guide by which the pressure sensor element has a pressure medium applied to it under pressure;
an evaluation unit to generate a pressure signal that is dependent on the pressure detected by the pressure sensor element in the pressure guide; and
a circuit carrier on which at least part of control electronics of the control unit is arranged;
wherein the pressure signal of the evaluation unit is introduced into the control electronics,
wherein at least part of the pressure guide makes direct contact with the circuit carrier and a sealing element is arranged in the contact region between the pressure guide and the circuit carrier, the sealing element sealing a region of the pressure guide to which the pressure medium is applied under pressure from the surroundings,
wherein the pressure sensor element is arranged directly on the circuit carrier, such that the pressure sensor element is arranged in the region of the pressure guide to which the pressure medium is applied under pressure,
wherein the evaluation unit is electrically directly connected to the circuit carrier,
wherein the evaluation unit and the pressure sensor element form a subassembly,
wherein the sealing element contains an elastic mold seal held in a recess or a groove, in a surface of the pressure guide pointing toward the circuit carrier, and
wherein the planar flange is detachably mounted on the planar circuit carrier with a tensile force of screws then compressing the O-ring to provide a sealing action.

2. The control unit of claim 1, wherein a circuit board of the evaluation unit makes direct contact with the circuit carrier.

3. The control unit of claim 2, wherein the evaluation unit has at least one electrical contact area that makes direct contact with the circuit carrier.

4. The control unit of claim 3, wherein the electrical contact area of the evaluation unit is bonded or soldered to the circuit carrier.

5. The control unit of claim 1, wherein the evaluation unit is formed by at least one ASIC.

6. The control unit of claim 1, wherein the evaluation unit and the at least one pressure sensor element are arranged on different lateral faces of the circuit carrier that point away from one another.

7. The control unit of claim 1, wherein the evaluation unit and the at least one pressure sensor element form a subassembly.

8. The control unit of claim 7, wherein the subassembly is arranged on a separate carrier or in a dedicated housing.

9. The control unit of claim 1, wherein the contact areas is protected from soiling by the sealing element, including at least one of a gel, a lacquer, and/or a solid seal.

10. The control unit of claim 1, wherein the sealing element contains an elastic mold seal, held in a recess in a surface of the pressure guide, that is pretensioned against a surface of the circuit carrier.

11. The control unit of claim 1, wherein the sealing element contains at least one adhesive bond between a surface of the pressure guide and a surface of the circuit carrier.

12. The control unit of claim 1, wherein the pressure guide is detachably or nondetachably connected to the circuit carrier.

13. The control unit of claim 1, wherein the O-ring is pretensioned against an opposite surface of the circuit carrier, so that the O-ring is held in the groove in an end face of a bushing that points toward the circuit carrier, which end face at the same time forms a flange surface of a flange arranged at the end of the bushing.

14. The control unit of claim 13, wherein a planar end face of the pressure guide contacts a planar surface of the circuit carrier directly and/or via the sealing element, so that a central or longitudinal axis of the pressure guide is arranged perpendicularly to the circuit carrier.

15. An electropneumatic braking device, which is operated with a pressure device, comprising:
at least one control unit for a vehicle, including:
at least one pressure sensor element;
a housing having a pressure guide by which the pressure sensor element has a pressure medium applied to it under pressure;

an evaluation unit to generate a pressure signal that is dependent on the pressure detected by the pressure sensor element in the pressure guide; and a circuit carrier on which at least part of control electronics of the control unit is arranged;

wherein the pressure signal of the evaluation unit is introduced into the control electronics, wherein at least part of the pressure guide makes direct contact with the circuit carrier and a sealing element is arranged in the contact region between the pressure guide and the circuit carrier, the sealing element sealing a region of the pressure guide to which the pressure medium is applied under pressure from the surroundings, wherein the pressure sensor element is arranged directly on the circuit carrier, such that the pressure sensor element is arranged in the region of the pressure guide to which the pressure medium is applied under pressure, wherein the evaluation unit is electrically directly connected to the circuit carrier, wherein the evaluation unit and the pressure sensor element form a subassembly, wherein the sealing element contains an elastic mold seal held in a recess or a groove, in a surface of the pressure guide pointing toward the circuit carrier, and wherein the planar flange is detachably mounted on the planar circuit carrier with a tensile force of screws then compressing the O-ring to provide a sealing action.

16. The electropneumatic braking device of claim 15, wherein the control unit takes the pressure signal of the evaluation unit as a basis for electrically controlling a solenoid valve device.

17. The electropneumatic braking device of claim 15, wherein the housing of the control unit is connected to a valve block of the solenoid valve device, and wherein the pressure guide is connected to at least one inlet or an outlet of at least one valve of the solenoid valve device.

18. The electropneumatic braking device of claim 15, wherein the O-ring is pretensioned against an opposite surface of the circuit carrier, so that the O-ring is held in the groove in an end face of a bushing that points toward the circuit carrier, which end face at the same time forms a flange surface of a flange arranged at the end of the bushing.

19. The electropneumatic braking device of claim 18, wherein a planar end face of the pressure guide contacts a planar surface of the circuit carrier directly and/or via the sealing element, so that a central or longitudinal axis of the pressure guide is arranged perpendicularly to the circuit carrier.

* * * * *

UNITED STATES PATENT AND TRADEMARK OFFICE
CERTIFICATE OF CORRECTION

PATENT NO. : 11,156,524 B2
APPLICATION NO. : 16/497272
DATED : October 26, 2021
INVENTOR(S) : Christian Huber et al.

Page 1 of 1

It is certified that error appears in the above-identified patent and that said Letters Patent is hereby corrected as shown below:

On the Title Page

In Item (54) and in the Specification Column 1 Line 1, replace:
"BREAKING DEVICE INCLUDING AN ELECTRONIC CONTROL UNIT FOR PRESSURE MEASUREMENTS"
With:
--BRAKING DEVICE INCLUDING AN ELECTRONIC CONTROL UNIT FOR PRESSURE MEASUREMENTS--

Signed and Sealed this
Twenty-fifth Day of January, 2022

Drew Hirshfeld
*Performing the Functions and Duties of the*
*Under Secretary of Commerce for Intellectual Property and*
*Director of the United States Patent and Trademark Office*